(12) United States Patent
Lee et al.

(10) Patent No.: US 9,595,446 B2
(45) Date of Patent: Mar. 14, 2017

(54) METHODS OF PROCESSING SUBSTRATES

(71) Applicant: Samsung Electronics Co., Ltd., Suwon-si, Gyeonggi-do (KR)

(72) Inventors: Chungsun Lee, Anyang-si (KR); Jung-Hwan Kim, Bucheon-si (KR); Kwang-chul Choi, Suwon-si (KR); Un-Byoung Kang, Hwaseong-si (KR); Jeon Il Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/150,906

(22) Filed: Jan. 9, 2014

(65) Prior Publication Data

US 2014/0213039 A1    Jul. 31, 2014

(30) Foreign Application Priority Data

Jan. 25, 2013  (KR) .................. 10-2013-0008695

(51) Int. Cl.
  *H01L 21/46* (2006.01)
  *H01L 21/302* (2006.01)
  (Continued)

(52) U.S. Cl.
  CPC ...... *H01L 21/302* (2013.01); *H01L 21/02057* (2013.01); *H01L 21/6835* (2013.01); *H01L 24/92* (2013.01); H01L 21/6836 (2013.01); H01L 24/03 (2013.01); H01L 24/13 (2013.01); H01L 24/16 (2013.01); H01L 24/17 (2013.01); H01L 24/94 (2013.01); H01L 2221/6834 (2013.01); H01L 2221/68318 (2013.01); H01L 2221/68327 (2013.01); *H01L 2221/68381* (2013.01); *H01L 2224/03002* (2013.01); *H01L 2224/036* (2013.01); *H01L 2224/0401* (2013.01); *H01L 2224/13025* (2013.01); *H01L 2224/16145* (2013.01); *H01L 2224/16146* (2013.01); *H01L 2224/16227* (2013.01); *H01L 2224/17181* (2013.01);
(Continued)

(58) Field of Classification Search
  CPC ............ H01L 2224/81; H01L 21/2007; H01L 2924/3512
  USPC .................................................. 438/455–459
  See application file for complete search history.

(56) References Cited

U.S. PATENT DOCUMENTS 5,863,832 A  1/1999 Doyle et al.
6,230,569 B1  5/2001 Ball
(Continued)

FOREIGN PATENT DOCUMENTS

JP  2005-129653  5/2005
JP  3832408  7/2006
(Continued)

*Primary Examiner* — Julia Slutsker
(74) *Attorney, Agent, or Firm* — Muir Patent Law, PLLC

(57) ABSTRACT

Methods processing substrates are provided. The method may include providing a bonding layer between a substrate and a carrier to bond the substrate to the carrier, processing the substrate while the substrate is supported by the carrier, and removing the bonding layer to separate the substrate from the carrier. The bonding layer may include a thermosetting glue layer and thermosetting release layers provided on opposing sides of the thermosetting glue layer.

20 Claims, 14 Drawing Sheets

(51) Int. Cl.
*H01L 21/683* (2006.01)
*H01L 21/02* (2006.01)
*H01L 23/00* (2006.01)

(52) U.S. Cl.
CPC .. *H01L 2224/92* (2013.01); *H01L 2224/9222* (2013.01); *H01L 2224/92222* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/15311* (2013.01)

(56) References Cited

U.S. PATENT DOCUMENTS

| | | | |
|---|---|---|---|
| 6,649,017 B1* | 11/2003 | Kurokawa | 156/711 |
| 7,196,872 B2 | 3/2007 | Chaw et al. | |
| 7,410,908 B2 | 8/2008 | Hara | |
| 8,017,439 B2 | 9/2011 | Takahashi et al. | |
| 8,181,688 B2 | 5/2012 | Johnson et al. | |
| 8,217,115 B2 | 7/2012 | Masuda et al. | |
| 8,221,571 B2 | 7/2012 | Hong et al. | |
| 8,236,118 B2 | 8/2012 | Veerasamy | |
| 8,313,982 B2 | 11/2012 | Dunne et al. | |
| 8,398,804 B2 | 3/2013 | Baqai et al. | |
| 2003/0107927 A1 | 6/2003 | Yerushalmi et al. | |
| 2004/0265531 A1 | 12/2004 | McKean et al. | |
| 2005/0066995 A1* | 3/2005 | Coico et al. | 134/2 |
| 2005/0221598 A1* | 10/2005 | Lu | H01L 21/6835 438/613 |
| 2005/0233547 A1* | 10/2005 | Noda | B32B 43/006 438/459 |
| 2007/0134846 A1 | 6/2007 | Takahashi et al. | |
| 2008/0302481 A1 | 12/2008 | Berger et al. | |
| 2010/0144120 A1* | 6/2010 | Segawa et al. | 438/464 |
| 2010/0173167 A1* | 7/2010 | Vissing et al. | 428/447 |
| 2010/0330788 A1 | 12/2010 | Yu et al. | |
| 2011/0048611 A1 | 3/2011 | Carre et al. | |
| 2011/0308739 A1 | 12/2011 | McCutcheon et al. | |
| 2012/0034437 A1 | 2/2012 | Puligadda et al. | |
| 2012/0329249 A1* | 12/2012 | Ahn et al. | 438/464 |
| 2013/0196484 A1* | 8/2013 | Moriceau et al. | 438/458 |

FOREIGN PATENT DOCUMENTS

| | | |
|---|---|---|
| JP | 2009-209345 | 9/2009 |
| JP | 4613709 | 10/2010 |
| JP | 2012-033889 | 2/2012 |

* cited by examiner

METHODS OF PROCESSING SUBSTRATES

CROSS-REFERENCE TO RELATED APPLICATIONS

This U.S. nonprovisional patent application claims priority under 35 U.S.C. §119(a) from Korean Patent Application 10-2013-0008695 filed on Jan. 25, 2013, the entire contents of which are hereby incorporated by reference.

BACKGROUND OF THE INVENTION

1. Field of the Invention

The present inventive concept relates to methods of processing substrates and, more particularly, to methods of thinning wafers.

2. Description of the Related Art

In a process of manufacturing a semiconductor, a wafer is bonded to a carrier with glue and release layers therebetween in order to thin the wafer by a back lap process. An ultraviolet (UV) curable adhesive is generally used as the glue layer. UV radiation is applied to the glue layer in order to use the UV curable adhesive, but the wafer can be damaged from the UV radiation. If instead a thermoplastic adhesive is adopted as the glue layer, a high temperature process cannot be applied due to poor thermal stability of the adhesive. Therefore, there is needed a method of bonding the wafer stably to the carrier without wafer damage even in the high temperature process.

SUMMARY OF THE INVENTION

Exemplary embodiments of the present general inventive concept provide methods of processing substrates in which a carrier can be bonded to the wafer with thermal stability.

Exemplary embodiments of the present general inventive concept also provide methods of processing wafers in which the carrier can be easily separated from the wafer.

Additional features and utilities of the present general inventive concept will be set forth in part in the description which follows and, in part, will be obvious from the description, or may be learned by practice of the general inventive concept.

Exemplary embodiments of the present general inventive concept provide a method of processing a substrate, the method including providing a bonding layer between a substrate and a carrier to bond the substrate to the carrier, the bonding layer including a thermosetting glue layer and thermosetting release layers provided on opposing sides of the thermosetting glue layer, processing the substrate while the substrate is supported by the carrier, and removing the bonding layer to separate the substrate from the carrier.

A bonding strength between the substrate and the bonding layer may be greater than a bonding strength between the carrier and the bonding layer.

The thermosetting release layers may include a first release layer provided between the thermosetting glue layer and the substrate, and a second release layer provided between the thermosetting glue layer and the carrier.

Providing the bonding layer may include providing a first thermosetting material on the substrate to form the first release layer, providing a second thermosetting material on the carrier to form the second release layer, and providing a third thermosetting material on at least one of the substrate and the carrier to form the glue layer.

Forming the first release layer may include coating a precursor including polydimethylsiloxane (PDMS) and hexamethyldisiloxane (HMDSO) on the substrate to form a precursor layer, and forming a deposition layer on the precursor layer by a chemical vapor deposition where the hexamethyldisiloxane (HMDSO) is adopted as a reaction gas.

Forming the second release layer may include coating a precursor including polydimethylsiloxane (PDMS) and hexamethyldisiloxane (HMDSO) on the substrate to form a precursor layer, and forming a deposition layer on the precursor layer by a chemical vapor deposition where the hexamethyldisiloxane (HMDSO) and oxygen are adopted as a reaction gas.

Forming the glue layer may include coating siloxane or a thermosetting material including the siloxane on at least one of the first and second release layers.

Forming the bonding layer may further include strengthening the first and second release layers and the glue layer.

Separating the substrate from the carrier may include forming a crack on an edge of the glue layer, detaching the carrier from the glue layer, plasma treating the glue layer, detaching the glue layer from the substrate, and cleaning the substrate.

Plasma treating the glue layer may include removing a remainder of the second release layer from the glue layer by plasma including at least one of oxygen, nitrogen and argon.

Cleaning the substrate may include providing a cleaning solution on the substrate to remove a remainder of the first release layer from the substrate, wherein the cleaning solution may include acetate mixed with at least one of diazabicycloundecene (DBU) and tetra-n-butylammonium fluoride (TBAF).

Providing the bonding layer may include providing a first thermosetting material on the substrate to form the first release layer and expose an edge of the substrate, providing a second thermosetting material on the carrier to form the second release layer and expose an edge of the carrier, and providing a third thermosetting material on at least one of the substrate and the carrier to form the glue layer, the glue layer contacting the exposed edges of the substrate and the carrier.

Exemplary embodiments of the present general inventive concept also provide a method of processing a substrate, the method including forming a first thermosetting release layer on a substrate, forming a second thermosetting release layer on a carrier, providing a thermosetting glue layer adhesive on the first and second thermosetting release layers between the substrate and the carrier to bond the substrate to the carrier, thinning the substrate while the substrate is supported by the carrier, separating the carrier from the substrate, plasma treating the glue layer to remove the second release layer on the glue layer, separating the glue layer from the thinned substrate, and removing the first release layer from the thinned substrate.

Thinning the substrate may include recessing a second surface of the substrate. The second surface may be opposite to a first surface on which the first release layer is formed. At least one through electrode included in the substrate may be exposed through the recessed second surface of the thinned substrate.

At least one of the first and second release layers may include at least one of polydimethylsiloxane (PDMS) and hexamethyldisiloxane (HMDSO). The glue layer may include siloxane.

The substrate may include a semiconductor wafer including a plurality of bumps and a plurality of through electrodes electrically connected to the bumps, and the carrier may include a glass or material identical to that of the substrate.

Removing the first release layer may include cleaning the thinned substrate.

Exemplary embodiments of the present general inventive concept also provide a method of processing a substrate, the method including providing a bonding layer bonded to a first surface of the substrate and a first surface of a carrier, a bonding force of the bonding layer and the substrate being greater than a bonding force of the bonding layer and the carrier, processing a second surface of the substrate opposite the first surface of the substrate while the bonding layer is bonded to the substrate and the carrier is bonded to the bonding layer, and removing the bonding layer from the substrate.

The bonding layer may include a thermosetting material.

Providing the bonding layer may include strengthening the bonding layer by exposing it to heat.

The bonding layer may include a glue layer, a first release layer bonded to the glue layer and the first surface of the substrate, and a second release layer bonded to the glue layer and the first surface of the carrier.

Removing the bonding layer may include propagating a crack through the second release layer to separate the carrier from the bonding layer, and removing at least the second release layer and the glue layer from the substrate after the carrier is separated from the bonding layer.

The glue layer may be bonded directly to at least one of an edge portion of the substrate and an edge portion of the carrier.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 2D is an enlarged view of a portion of FIG. 2C;

DETAILED DESCRIPTION OF THE EMBODIMENTS

Figure 1A:
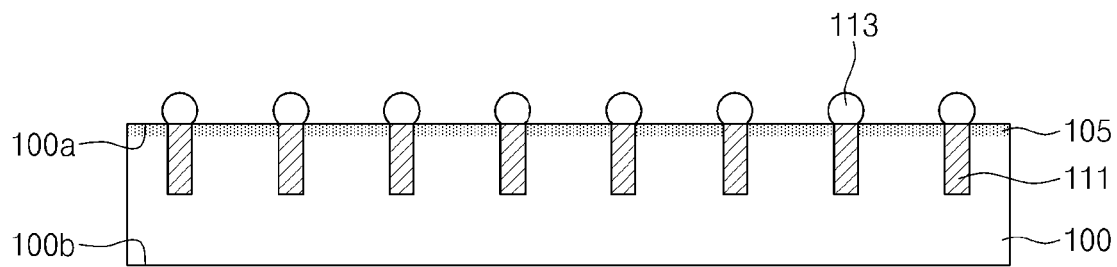
FIGS. 1A to 1P are cross sectional views illustrating a method of processing a substrate according to exemplary embodiments of the present general inventive concept.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein. Rather, these example embodiments are provided so that this disclosure will be thorough and complete, and will fully convey the scope of exemplary embodiments of inventive concepts to those of ordinary skill in the art. In the drawings, the thicknesses of layers and regions are exaggerated for clarity. Like reference numerals in the drawings denote like elements. Hereinafter, exemplary embodiments of the present general inventive concept will be described with reference to the accompanying drawings. The drawings are not necessarily to scale, emphasis instead being placed upon illustrating the principles of the present general inventive concept.

Figure 1B:
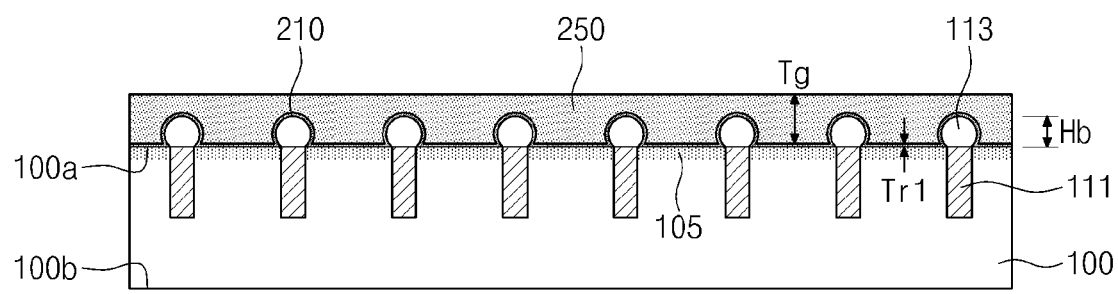
FIGS. 1C, 1E, and 1I are cross sectional views illustrating portions of FIGS. 1B, 1D, and 1H, respectively.
FIGS. 1F and 1G are cross sectional views illustrating modified examples of the exemplary embodiment of the present general inventive concept illustrated in FIG. 1B.
FIG. 1Q is a cross sectional view illustrating a method of fabricating a semiconductor chip using the method of processing a substrate according to an exemplary embodiment of the present general inventive concept.
FIG. 1R is a cross sectional view illustrating a method of fabricating a semiconductor package using the method of processing a substrate according to an exemplary embodiment of the present general inventive concept.
Figure 1C:
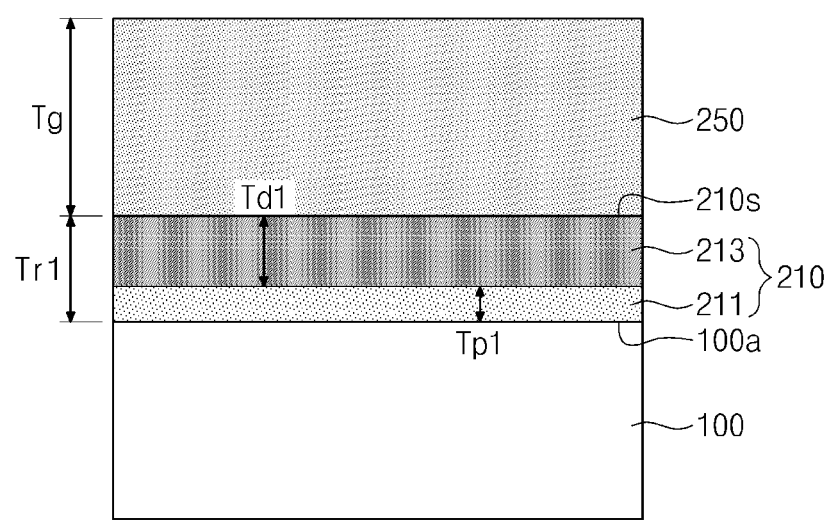
Figure 1D:
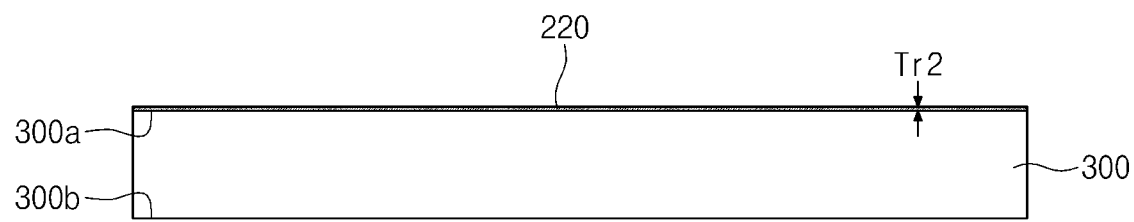
Figure 1E:
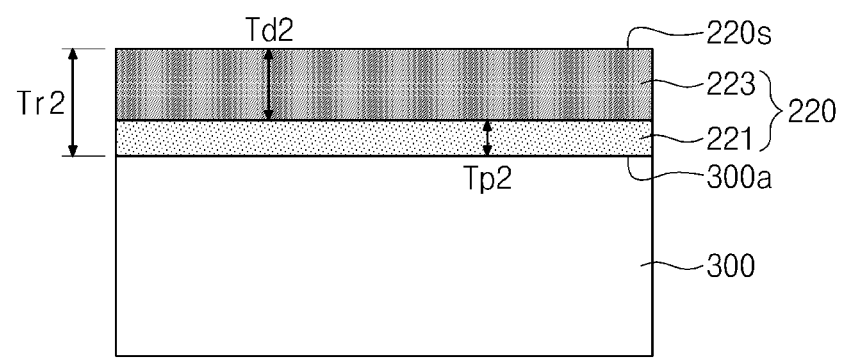
Figure 1F:
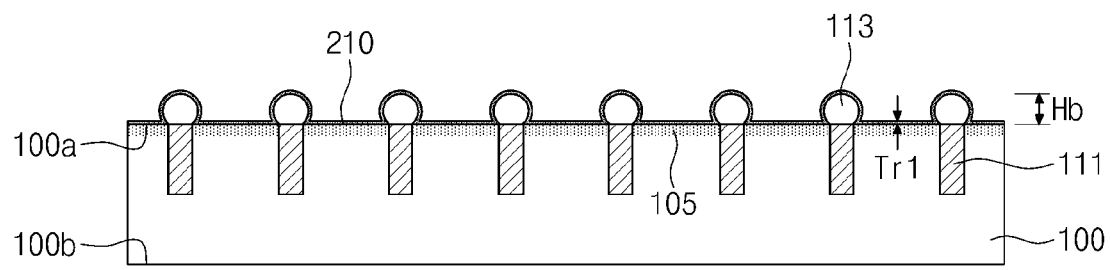
Figure 1F:
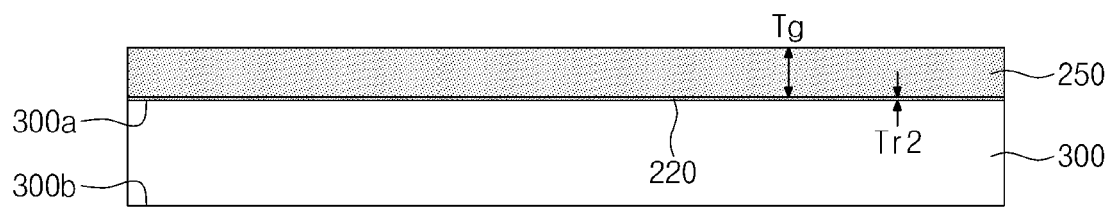
Figure 1G:
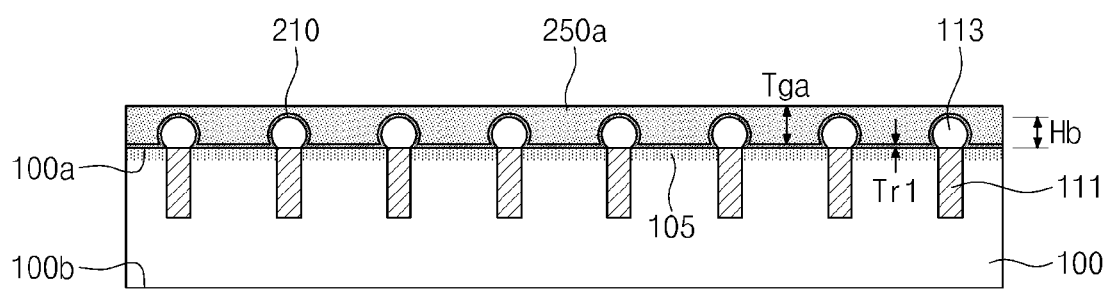
Figure 1G:
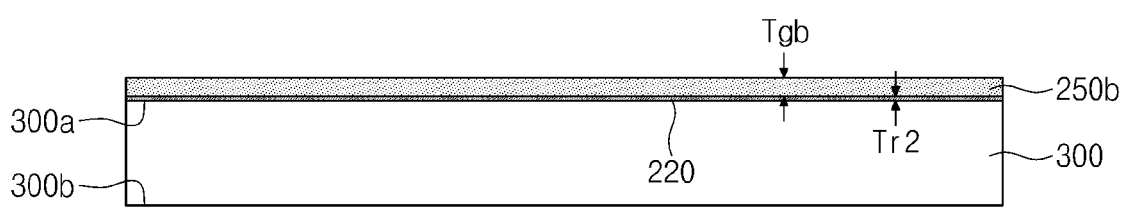
Figure 1H:
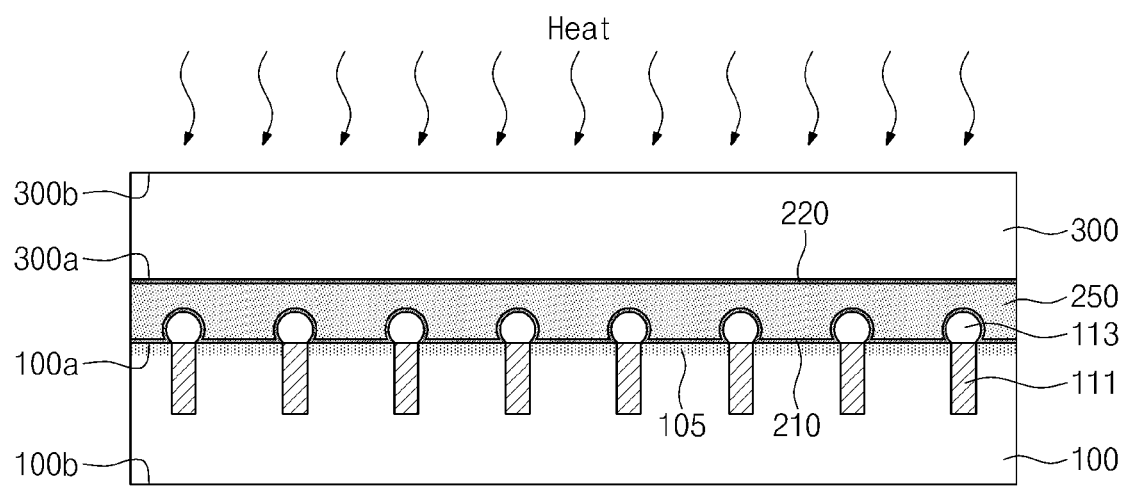
Figure 1I:
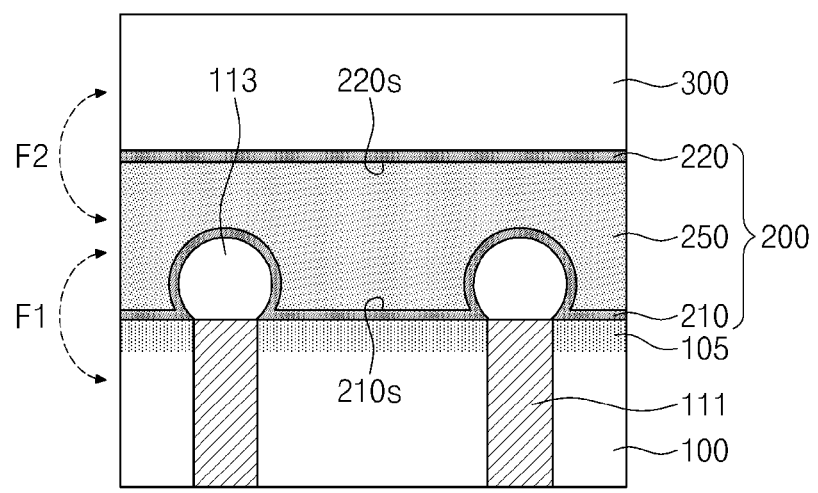
Figure 1J:
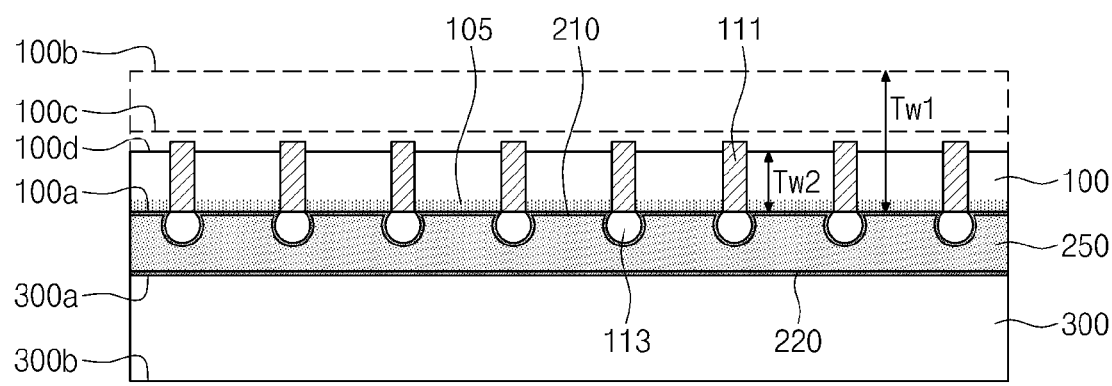
Figure 1K:
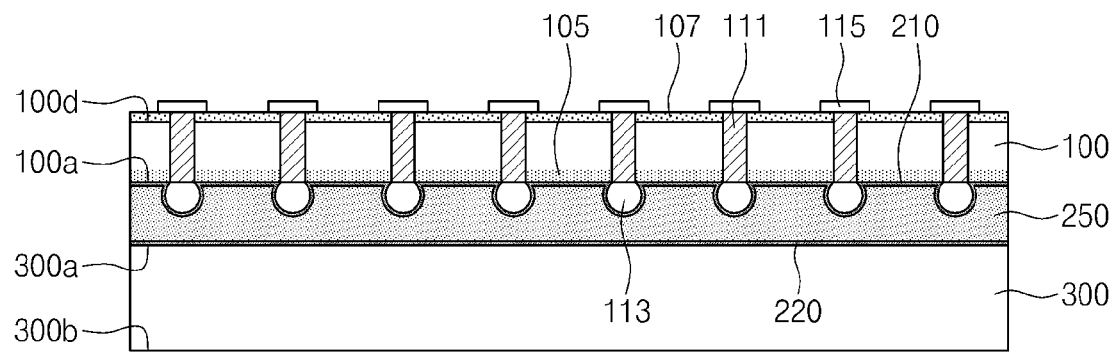
Figure 1L:
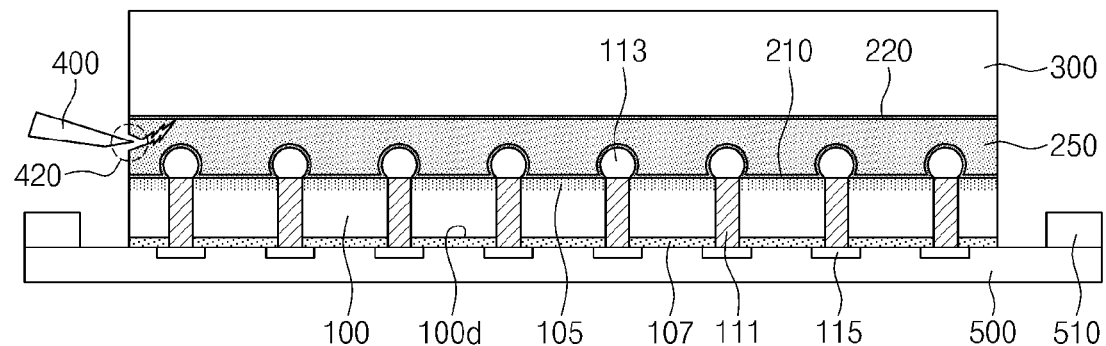
Figure 1M:
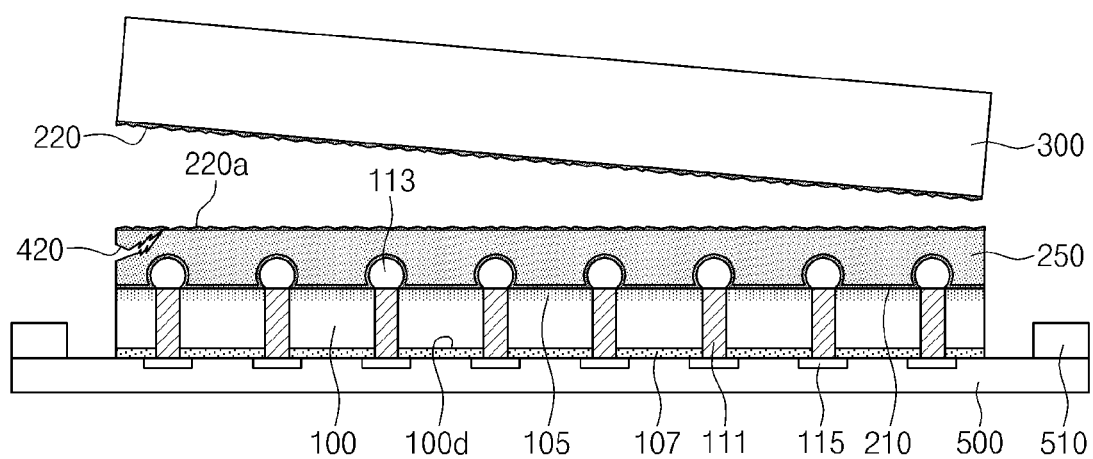
Figure 1N:
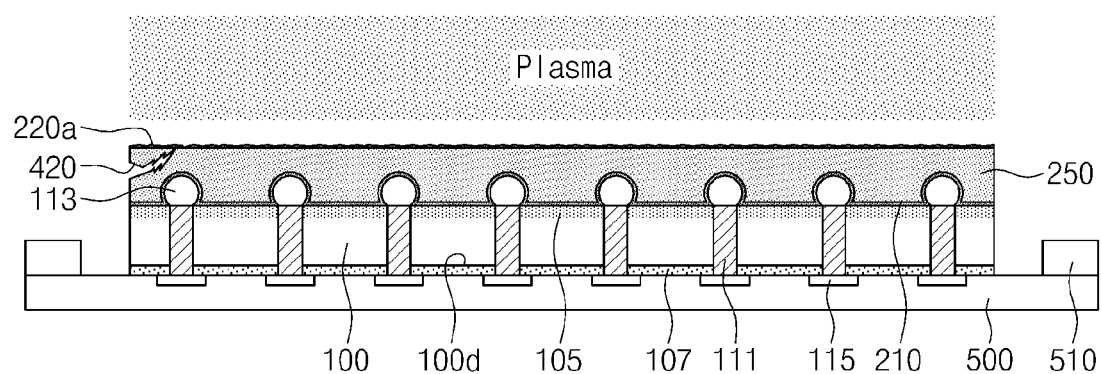
Figure 1O:
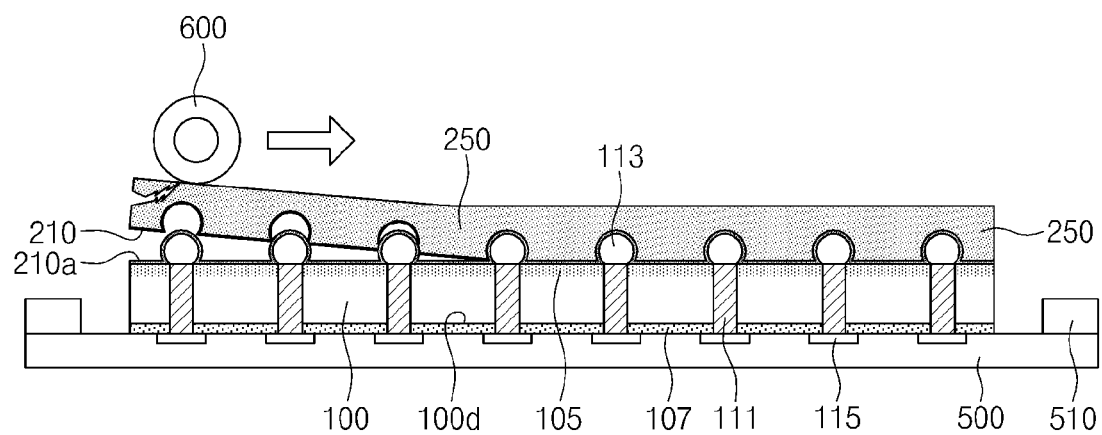
Figure 1P:
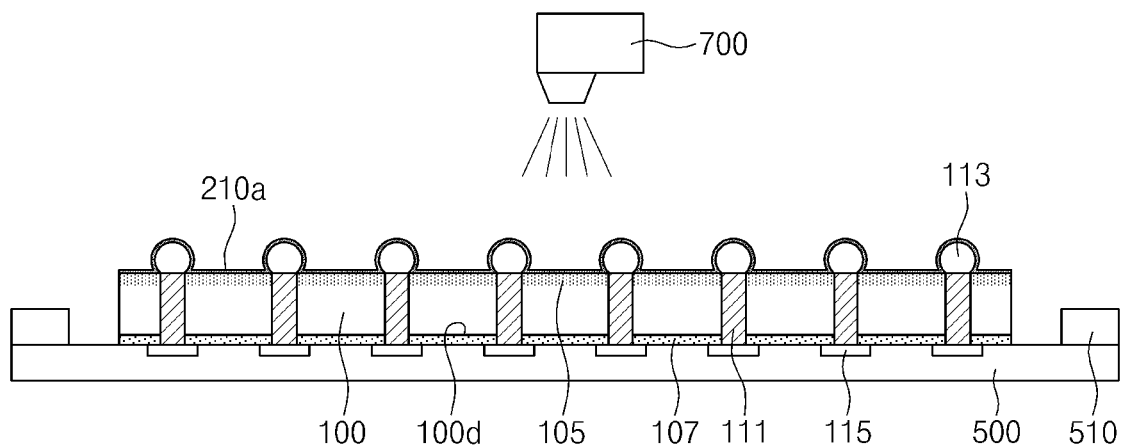

FIGS. 1A to 1P are cross sectional views illustrating a method of processing a substrate 100 according to exemplary embodiments of the present general inventive concept. FIGS. 1C, 1E, and 1I are cross sectional views of portions of FIGS. 1B, 1D, and 1H, respectively. FIGS. 1F and 1G are cross sectional views illustrating modified examples of the exemplary embodiment of the present general inventive concept illustrated in FIG. 1B.

Referring to FIG. 1A, the substrate 100 may be provided. The substrate 100 may be a wafer level semiconductor substrate such as silicon wafer. The substrate 100 may be referred to as a wafer 100 hereinafter. The wafer 100 may comprise an upper surface 100a at which an integrated circuit 105 is formed and a lower surface 100b opposite the upper surface 100a. The integrated circuit 105 may comprise a memory circuit, a logic circuit, or a combination thereof. The wafer 100 may comprise a plurality of through electrodes 111 which extend in a thickness direction of the wafer 100 and have lengths partially penetrating the wafer 100. A plurality of bumps 113 may be provided on the upper surface 100a of the wafer 100. The bumps 113 may be electrically connected to the plurality of through electrodes 111.

Referring to FIGS. 1B and 1C, a first release layer 210 and a glue layer 250 may be formed on the upper surface 100a of the wafer 100. Each of the first release layer 210 and the glue layer 250 may comprise a thermosetting material. According to some exemplary embodiments, the first release layer 210 may be formed by a chemical vapor deposition adopting a material including silicone (identified by a chemical structure described below) as a precursor.

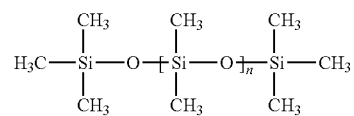

For example, the first release layer 210 may be formed by a chemical vapor deposition using a siloxane-based material (e.g., polydimethylsiloxane (PDMS), hexamethyldisiloxane (HMDSO), or a combination thereof) as a precursor and the HMDSO as a source.

The first release layer 210 may be formed by coating and depositing a precursor. For example, a first precursor layer 211 may be formed by spin coating a precursor on the upper surface 100a of the wafer 100. The precursor may comprise the PDMS as a main material of the first release layer 210 and a liquid HMDSO as a solvent with a ratio of about 1:50 to about 1:200 (e.g., PDMS:HMDSO=1:50). A first chemical vapor deposition layer 213, such as silicone, may be formed by a plasma enhanced chemical vapor deposition adopting a gaseous HMDSO as a source.

The spin coating may be performed for several tens of seconds (e.g., about 20 seconds). The PECVD may be performed under the condition that a RF power of about tens of watts (e.g., about 40 W), a chamber pressure of about tens of millitorr (e.g., about 40 mTorr), a plasma time of about several tens of seconds to minutes (e.g., about 65 seconds), and an HMDSO gas flow rate of about tens of standard cubic centimeters per minute (e.g., about 15 sccm). According to some exemplary embodiments of the present general inventive concept, the first release layer 210 may have a multiple layer structure including the first chemical deposition layer 213 stacked on the first precursor layer 211 and having a surface 210s such as $SiO_2$. Alternatively, the first release layer 210 may have a single layer structure including a siloxane-based material.

The first release layer 210 may extend along the upper surface 100a of the wafer 100. For example, the first release layer 210 may have a bending shape extending along the profile of bumps 113.

The glue layer 250 may be formed by coating the silicone described above or a thermosetting resin including the silicone on the first release layer 210. For example, the glue layer 250 may be formed of a siloxane-based material. Alternatively, the glue layer 250 may be formed of tripropylenemelamine (TMAT) or any material having the TMAT.

The glue layer 250 may have a thickness Tg more than about 110~120% of a height Hb of the bump 113. The first release layer 210 may have a thickness Tr1 less than the thickness Tg of the glue layer 250. The thickness Tr1 of the first release layer 210 may be less than the height Hb of the bump 113. The glue layer 250 may have the thickness Tg of about tens to hundreds of micrometers while the first release layer 210 may have the thickness Tr1 of about tens to hundreds of nanometers. For example, the glue layer 250 may have the thickness Tg of about 70 to about 120 μm. The first precursor layer 211 may have a thickness Tp1 of about 50 to about 70 nm, and the first chemical vapor deposition layer 213 may have a thickness Td1 of about 150 nm, so that the first release layer 210 may have the thickness Tr1 of about 200 nm to about 220 nm, but this is not a limitation. For example, the first release layer 210 may have the thickness Tr1 of about 20 nm to about 230 nm, or about 50 nm to about 150 nm.

The glue layer 250 may be bonded to $SiO_2$ constituting the surface 210s of the first release layer 210 with a relatively strong force while the first precursor layer 211 may be bonded to the upper surface 100a of the wafer 100 with a relatively weak force (e.g., Van der Waals force). As such, the first release layer 210 may provide the relatively weak strength or force between the wafer 100 and the glue layer 250 such that the glue layer 250 may be easily detached from the wafer 100.

The thickness Tr1 of the first release layer 210 may be inversely proportional to a force required to detach the glue layer 250 from the wafer 100. For example, the greater the thickness Tr1 of the first release layer 210, the lower the force to separate the glue layer 250. The thickness Tr1 of the first release layer 210 may depend on the thickness Tb1 of the first precursor layer 211 and/or the condition of the PECVD used to form the first precursor layer 211.

The thickness Tr1 of the first release layer 210 may be proportional to the thickness Tb1 of the first precursor layer 211. For example, if the ratio of the PDMS to the HMDSO becomes greater (i.e., the HMDSO content becomes higher) and the coating speed becomes lower (i.e., spin speed becomes lower), the thickness Tb1 of the first precursor layer 211 may become greater.

The thickness Tr1 of the first release layer 210 may depend on the deposition rate. For example, if the RF power is greater, the chamber pressure is lower, and the plasma time (i.e., process time) is longer, the deposition rate may be greater. As a result, the thickness Tr1 of the first release layer 210 may be greater.

The first release layer 210 may become stronger or harder if the plasma intensity becomes greater and the plasma time becomes longer. Differently, the first release layer 210 may become weaker or softer if the plasma intensity becomes less and the plasma time becomes shorter. If the first release layer 210 is much stronger or harder, the first release layer 210 may be delaminated from the wafer 100 and/or cracks may occur in the first release layer 210. If the first release layer 210 is much weaker or softer, the first release layer 210 may remain in liquid state and be easily wiped off from the wafer 100. Under the plasma deposition condition described above, the first release layer 210 may have a stable structure identical or analogous to a fully cross-linked structure.

Referring to FIGS. 1D and 1E, a carrier 300 may be provided. The carrier 300 may be a silicon substrate having a size and material identical or analogous to those of the wafer 100. Alternatively, the carrier 300 may be a transparent substrate such as a glass. The carrier 300 may comprise an upper surface 300a and a lower surface 300b opposite the upper surface 300a. A second release layer 220 may be formed on the upper surface 300a of the carrier 300.

The second release layer 220 may comprise a thermosetting material identical or analogous to that of the first release layer 210. For example, a second precursor layer 221 may be formed by spin coating a precursor on the upper surface 300a of the carrier 300. The precursor may comprise the PDMS as a main material of the second release layer 220 and a liquid HMDSO as a solvent with a ratio of about 1:50 to about 1:200 (e.g., PDMS:HMDS=1:200). And, a second chemical vapor deposition layer 223 may be formed by a PECVD adopting a gaseous HMDSO as a source. As a result, the second release layer 220 may have a multiple layer structure including the second chemical vapor deposition layer 223 stacked on the second precursor layer 221. Alternatively, the second release layer 223 may have a single layer structure including a siloxane-based material.

The second release layer 221 may be bonded to the carrier 300 with a relatively weak force (e.g., Van der Waals force). Due to the weak force, the carrier 300 may not stably support the wafer 100 when the wafer processing is performed as described later with reference to FIG. 1J.

According to some exemplary embodiments of the present general inventive concept, oxygen may be further added to the HMDSO source gas to improve the bonding force between the second release layer 220 and the carrier 300. This addition of oxygen may improve the density of the second release layer 220 and an interface between the second release layer 220 and the carrier 300, so that the second release layer 220 may be firmly bonded to the carrier 300.

The spin coating may be performed for several tens of seconds (e.g., about 20 seconds). The PECVD may be performed under the condition that a RF power of about tens of watts (e.g., about 40 W), a chamber pressure of about tens of mTorr (e.g., about 40 mTorr), a plasma time of about several tens of seconds (e.g., about 65 seconds), an oxygen gas flow rate of about tens of sccm (e.g., about 15 sccm), and an HMDSO gas flow rate of about tens of sccm (e.g., about 15 sccm). According to some exemplary embodiments of the present general inventive concept, the second release layer 220 may have a multiple layer structure including the second chemical deposition layer 223 such as silicone stacked on the second precursor layer 221 and having a surface 220s such as $SiO_2$.

The second release layer 220 may have a thickness Tr2 identical or analogous to that of the first release layer 210. For example, the second precursor layer 221 may have a thickness Tp2 of about 50 nm to about 70 nm and the second chemical vapor deposition layer 223 may have a thickness Td2 of about 150 nm such that the second release layer 220 may have the thickness Tr2 of about 200 nm to about 220 nm. Alternatively, the second release layer 220 may have the thickness Tr2 of about 20 nm to about 230 nm, or about 50 nm to about 150 nm.

When the wafer 100 and the carrier 300 are bonded together as illustrated later in FIG. 1I, the glue layer 250 may be bonded to $SiO_2$ constituting a surface 220s of the second release layer 220 with a relatively strong force while the second precursor layer 221 may be bonded to the upper surface 300a of the carrier 300 with a relatively weak force (e.g., Van der Waals force). As such, the second release layer 220 may provide the relatively weak strength between the carrier 300 and the glue layer 250 such that the glue layer 250 may be easily detached from the carrier 300.

The thickness Tr2 of the second release layer 220 may be inversely proportional to a force required to detach the carrier 300 from the glue layer 250. For example, the greater the thickness Tr2 of the second release layer 220, the lower the force to separate the glue layer 250. The thickness Tr2 of the second release layer 220 may depend on the thickness Tb2 and/or a deposition rate of the second precursor layer 221.

Alternatively, as illustrated in FIG. 1F, the glue layer 250 may be formed on the carrier 300. For example, the first release layer 210 may be formed on the upper surface 100a of the wafer 100, and the second release layer 220 and the glue layer 250 may be sequentially formed on the upper surface 300a of the carrier 300.

Alternatively, as illustrated in FIG. 1G, a first glue layer 250a may be formed on the wafer 100 and a second glue layer 250b may be formed on the carrier 300. For example, the first release layer 210 and the first glue layer 250a may be sequentially formed on the upper surface 100a of the wafer 100, and the second release layer 220 and the second glue layer 250b may be sequentially formed on the upper surface 300a of the carrier 300. As described below with reference to FIG. 1H, when the wafer 100 is bonded to the carrier 300, the first glue layer 250a and the second glue layer 250b may be coupled together to form the glue layer 250. The first glue layer 250a may have a first thickness Tga and the second glue layer 250b may have a second thickness Tgb. The sum of the first and second thicknesses Tga and Tgb may correspond to the thickness Tg of the glue layer 250 of FIG. 1C. The first and second glue layers 250a and 250b may respectively be formed of the same material as the glue layer 250.

Referring to FIGS. 1H and 1I, the wafer 100 and the carrier 300 may be bonded together. For example, the carrier 300 may be bonded to the wafer 100 with the upper surface 100a of the wafer 100 facing the upper surface 300a of the carrier 300. The wafer 100 and the carrier 300 may be bonded together by a bonding layer 200 including the glue layer 250 and the first and second release layers 210 and 220 which are adhered to both surfaces of the glue layer 250. Selectively, the first and second release layers 210 and 220 and the glue layer 250 may be strengthened by supplying heat, to improve heat-resistance and/or adhesion properties. Such strengthening is possible if the first and second release layers 210 and 220 and the glue layer 250 are formed of thermosetting materials.

If the bonding layer 200 is quickly strengthened at a relatively high temperature, cracks may be created. The wafer 100 may be first baked in a deposition chamber at a low temperature which is not high enough to strengthen the bonding layer 200, and thereafter the wafer 100 may be second baked in a bake chamber at a high temperature which is high enough to strengthen the bonding layer 200. This two-stage method may prevent the occurrence of cracks. The first and second baking processes may each be performed for several minutes. For example, the first baking process may be performed at a temperature of about 100° C. to about 180° C. for about 5 minutes to about 15 minutes, and the second baking process may be performed at a temperature of about 150° C. to about 250° C. for about 5 minutes to about 15 minutes.

A surface topology or roughness may be found on the upper surface 100a of the wafer 100 because the wafer 100 may have the bumps 113 formed thereon. Even when the first release layer 210 is bonded to the wafer 100 with Van der Waals force, the bonding force between the wafer 100 and the first release layer 210 may become stronger due the topology or roughness of the wafer 100. The spherical shape bumps 113 may make strengthen the bonding force between the wafer 100 and the first release layer 210.

The upper surface 300a of the carrier 300 may be smoother or flatter than the upper surface 100a of the wafer 100. The carrier 300 may be weakly bonded to the second release layer 220 due to the smooth surface 300a and/or the Van der Waals force, but the bonding force between the second release layer 220 and the carrier 300 may become stronger by addition of oxygen to the HDMSO mentioned earlier.

According to some exemplary embodiments of the present general inventive concept, even the bonding force between the carrier 300 and the second release layer 220 becomes stronger by the addition of oxygen, the bonding force between the carrier 300 and the second release layer 220 may be less than the bonding force between the wafer 100 and the first release layer 210 because the surface topology or roughness of the wafer 100 may improve the bonding force between the wafer 100 and the first release layer 210. Consequently, a first bonding force F1 between the wafer 100 and the bonding layer 200 may be greater than a second bonding force F2 between the carrier 300 and the bonding layer 200. The first bonding force F1 is defined as the force necessary to separate the wafer 100 and the bonding layer 200, and the second boding force F2 is defined as the force necessary to separate the carrier 300 and the bonding layer 200.

The first bonding force F1 may be for example about 1.3 times the second bonding force F2. The difference between the first and second bonding forces F1 and F2 may depend on formation conditions of the first and second release layers 210 and 220. For example, the first and second bonding forces F1 and F2 may vary according to source concentration, thickness, and/or gas contents of the first and second release layers 210 and 220.

Referring to FIG. 1J, the wafer 100 may be back-lapped. According to some exemplary embodiments of the present general inventive concept, while the wafer 100 is supported by the carrier 300, that is, while the carrier 300 is attached by the bonding layer 200 to the upper surface 100a of the wafer 100, the wafer 100 may be thinned by carrying out one of a chemical mechanical polishing, a wet etching, a dry etching, a spin etching, a grinding, and so forth on the lower surface 100b of the wafer 100 one time or several times, until the through electrodes 111 are exposed.

For example, a chemical mechanical polishing process may be carried out on the lower surface 100b of the wafer 100 and may be performed to create at least a second lower surface 100c, at which the through electrodes 111 are not exposed. A dry etching process may be further carried out on the second lower surface 100c and may be performed to create at least a third lower surface 100d, at which the through electrodes 111 are exposed. Alternatively, the lower surface 100b of the wafer 100 may be recessed to create the third lower surface 100d by a single process such as chemical mechanical polishing. In some exemplary embodiments of the present general inventive concept, the upper surface 100a of the wafer 100 may be referred to as an 'active surface 100a', and the third lower surface 100d of the wafer 100 may be referred to as a 'non-active surface 100d'.

The wafer 100 may be thinned to have a second thickness Tw2 from a first thickness Tw1 due to the back-lap process. For example, the first thickness Tw1 may be about several hundreds of micrometers and the second thickness Tw2 may be about several tens of nanometers. The thinned wafer 100 may be difficult to handle on its own without damaging it. However, the carrier 300 attached to the wafer 100 may provide an ease of handling the wafer 100.

Referring to FIG. 1K, a lower insulation layer 107 may be formed to cover the non-active surface 100d of the wafer 100, and a plurality of pads 115 may be formed on the lower insulation layer 107 to be electrically connected to the through electrodes 111. For example, an insulator may be deposited on the non-active surface 100d to cover the through electrodes 111 and planarized to expose the through electrodes 111, thereby forming the lower insulation layer 107. And then, a conductor may be deposited on the lower insulation layer 107 and patterned to form the pads 115 that are electrically connected to the through electrodes 111.

According to some exemplary embodiments of the present general inventive concept, it a high temperature condition may be required to perform the wafer thinning process illustrated in FIG. 1J and/or the post-fabrication process illustrated in FIG. 1K. Compared to glue and release layers which include a thermoplastic material, the thermosetting glue layer 250 and the release layers 210 and 220 may have a high temperature stability at the high temperature process. It may therefore be possible to maintain a stable bonding between the wafer 100 and the carrier 300 at the high temperature process.

Referring to FIG. 1L, a crack 420 may be formed in the glue layer 250. The crack 420 may be created by a physical method. For example, an initiator 400 such as blade may impact on the glue layer 250 to create the crack 420. When the carrier 300 is detached from the wafer 100, the crack 420 may propagate through the carrier 300 and/or the second release layer 220. Since the second release layer 220 is formed on the carrier 300, it may have a substantially straight shape, while the first release layer 210 may have a substantially curved shape, due to being formed over bumps 113. As a result, the second release layer 220 constitutes the path of least resistance for a crack, and so the crack 420 may propagate preferably through the second release layer 220 instead of the first release layer 210. Selectively, a protection tape 500 may be attached to the non-active surface 100d of the wafer 100 and a holder 510 may be further provided to stably fix the wafer 100 during the process of propagating the crack 420.

Referring to FIG. 1M, the carrier 300 may be easily separated from the wafer 100 because the second release layer 220 has the crack 420 propagated therethrough and/or the first bonding force F1 between the wafer 100 and the bonding layer 200 is greater than the second bonding force F2 between the carrier 300 and the bonding layer 200 as formerly described in FIG. 1I. A residue 220a of the second release layer 220 may remain on the glue layer 250 when the carrier 300 is separated from the wafer 100.

The bumps 113 may be interlocked when the glue layer 250, as well as the carrier 300, is separated from the wafer 100. If the bumps 113 are too high or the number of the bumps 113 is substantially great, the bump interlocking may become intense, such that the bumps 113 may be damaged or detached from the wafer 100 while the carrier 300 is separated from the wafer 100. According to some exemplary embodiments of the present general inventive concept, since the crack 420 may propagate preferably through the second release layer 220, the bump interlocking may be reduced or prevented when the carrier 300 is separated from the wafer 100. Therefore, the bumps 113 may be free of damages after separating the carrier 300 from the wafer 100.

Referring to FIG. 1N, the residue 220a may be removed. The residue 220a on the glue layer 250 may make weak a bonding force between a rolling tape (600, illustrated in FIG. 1O) and the glue layer 250, so that the glue layer 250 may be not easily separated from the wafer 100. According to some exemplary embodiments of the present general inventive concept, a plasma treatment may be further performed to remove the residue 220a, as illustrated in FIG. 1N. The plasma treatment may use plasma including at least of oxygen, nitrogen, and argon.

Referring to FIG. 1O, the glue layer 250 may be removed. In some exemplary embodiments of the present general inventive concept, the glue layer 250 may be adhered to a rolling tape 600 that is moved along the wafer 100 to strip the glue layer 250. A bonding force between the rolling tape 600 and the glue layer 250 may be greater than the bonding force between the glue layer 250 and the first release layer 210. Since the residue 220a is already removed from the glue layer 250 by the plasma treatment as formerly mentioned above with reference to FIG. 1N, the bonding force between the rolling tape 600 and the glue layer 250 may be so strong that the glue layer 250 may be more easily separated from the wafer 100.

Referring to FIG. 1P, the wafer 100 may be cleaned. The wafer cleaning process may remove a residue 210a of the first release layer 210 on the upper surface 100a of the wafer 100. For example, a cleaning solution may be sprayed to the wafer 100 through a spray 700 to remove the residue 210a of the first release layer 210. The cleaning solution may comprise at least one of diazabicycloundecene (DBU) and tetra-n-butylammonium fluoride (TBAF) that is mixed with a solvent such as acetate. The above mentioned processes may fabricate a thinned wafer 100 including the through electrodes 111. The thinned wafer 100 may be packed through processes which will be described later.

Figure 1Q:
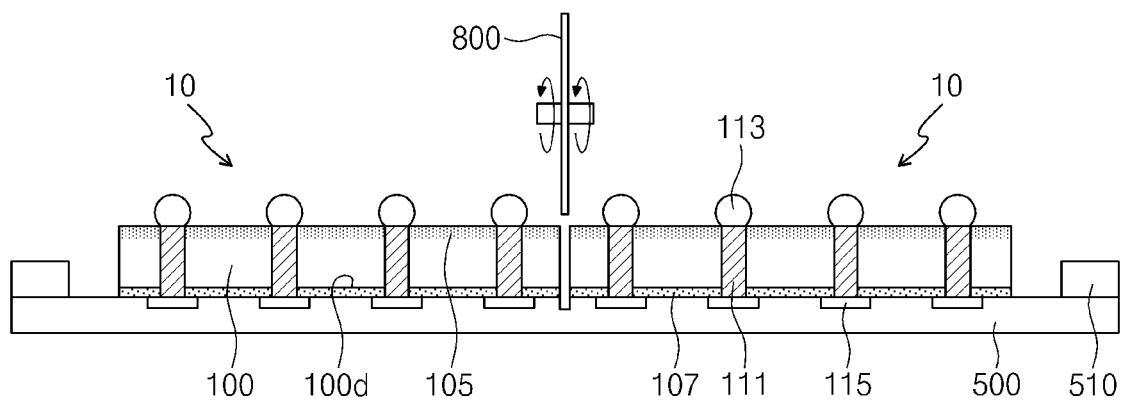
Figure 1R:
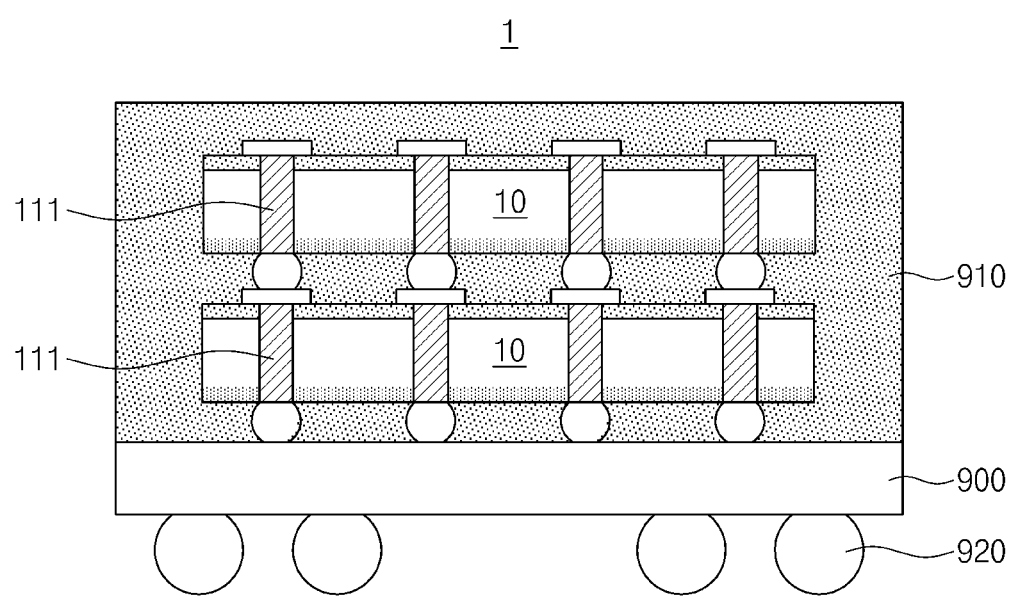

FIG. 1Q is a cross sectional view illustrating a method of fabricating a semiconductor chip 10 using the method of processing a substrate according to exemplary embodiments of the present general inventive concept. FIG. 1R is a cross sectional view illustrating a method of fabricating a semiconductor package 1 using the method of processing a substrate according to exemplary embodiments of the present general inventive concept.

Referring to FIG. 1Q, the wafer 100 may be divided into a plurality of semiconductor chips 10 by a wafer sawing process. The wafer sawing process may be performed to cut the wafer 100 along a scribe lane (not illustrated) using a cutting wheel 800, to be divided into the semiconductor chips 10. At least one of the semiconductor chips 10 may be packed. Alternatively, the wafer sawing process may be carried out using a laser or other precision cutting tool.

Referring to FIG. 1R, at least one of the semiconductor chips 10 may be mounted on a printed circuit board 900 and the at least one semiconductor chip 10 may be molded to form the semiconductor package 1. For example, more than one semiconductor chips 10 may be mounted on an upper surface of the printed circuit board 900 and then a mold layer 910 may be formed of insulator such as epoxy molding compound (EMC). In the semiconductor package 1, the semiconductor chips 10 may be flip-chip bonded and the through electrodes 111 may provide electrical paths between the printed circuit board 900 and the semiconductor chips 10 and/or between the semiconductor chips 10. An external terminal 920 such as a solder ball may be further provided on a lower surface of the printed circuit board 900.

Figure 2A:
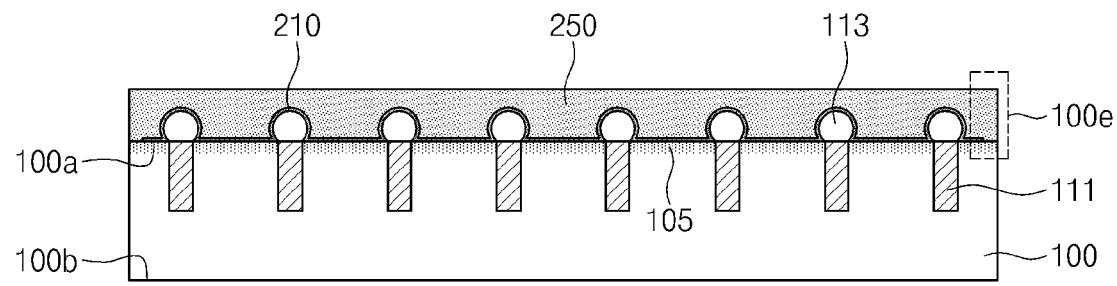
FIGS. 2A to 2F are cross sectional views illustrating a method of processing a substrate according to another exemplary embodiment of the present general inventive concept.
Figure 2B:
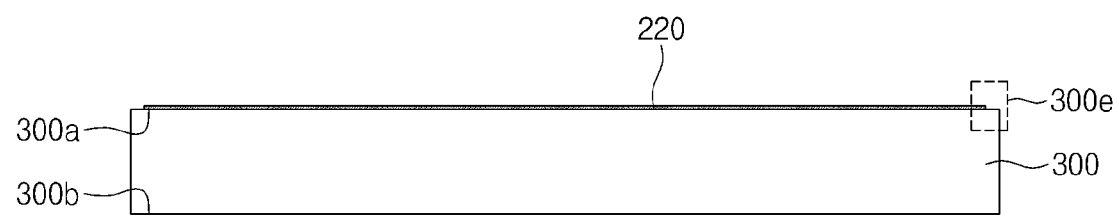
Figure 2C:
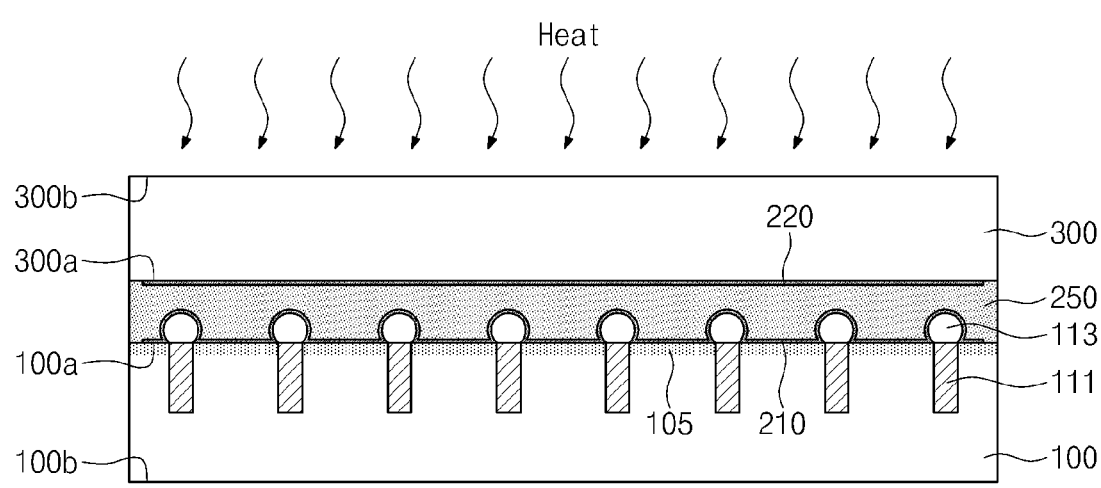
Figure 2D:
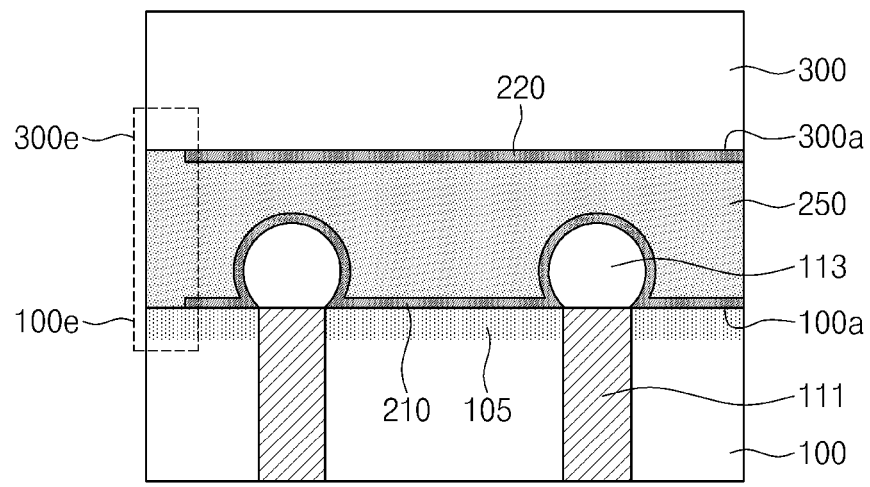

FIGS. 2A to 2F are cross sectional views illustrating a method of processing a substrate or wafer 100 according to another exemplary embodiment of the present general inventive concept. FIG. 2D is an enlarged view of a portion of FIG. 2C.

Referring to FIG. 2A, a first release layer 210 and a glue layer 250 may be formed on an active surface 100*a* of the wafer 100. For example, a thermosetting material may be spin coated and chemical vapor deposited on the active surface 100*a* of the wafer 100 and then patterned to form the first release layer 210. Due to the patterning process, the first release layer 210 may expose an edge 100*e* of the wafer 100. A glue layer 250 may be formed on the first release layer 210 to contact with the edge 100*e* of the wafer 100.

Referring to FIG. 2B, a second release layer 220 may be formed on a carrier 300. A thermosetting material identical or analogous to that of the first release layer 210 may be spin coated and chemical vapor deposited on an upper surface 300*a* of the carrier 300 and then patterned to form the second release layer 220. The second release layer 220 may expose an edge 300*e* of the carrier 300. The edge 300*e* of the carrier 300 may face the edge 100*e* of the wafer 100.

Alternatively, the glue layer 250 may be formed on the carrier 300 as illustrated in FIG. 1F. As yet another alternative, a first glue layer 250*a* may be formed on the wafer 100 and a second glue layer 250*b* may be formed on the carrier 300, as illustrated for example in FIG. 1G.

Referring to FIGS. 2C and 2D, the wafer 100 and the carrier 300 may be bonded together in which the active surface 100*a* of the wafer 100 may face the upper surface 300*a* of the carrier 300. Selectively, the first and second release layers 210 and 220 and the glue layer 250 may be strengthened by supplying heat. According to some exemplary embodiments of the present general inventive concept, the glue layer 250 may be interposed between the first release layer 210 and the second release layer 220, and may be in direct contact with both the wafer 100 and the carrier 300 at the edges 100*e* and 300*e*, in the area indicated by the dotted line in FIG. 2D. Therefore, the wafer 100 and the carrier 300 may be firmly bonded together at the edge 100*e* of the wafer 100. Alternatively, a portion of the glue layer 250 which is provided on the edge 100*e* of the wafer 100 may be removed by soaking the wafer 100 in chemical solution or by using a laser or other precision cutting tool.

Figure 2E:
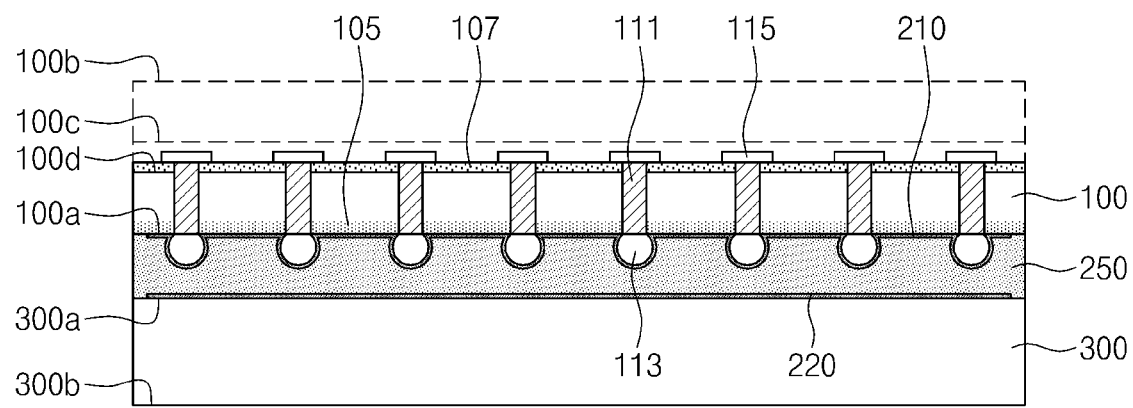

Referring to FIG. 2E, a lower surface 100*b* of the wafer 100 may be polished by a chemical mechanical polishing process until a second lower surface 100*c* at which through electrodes 111 are not exposed, and the second lower surface 100*c* may be recessed by a dry etching process to create a non-active surface 100*d*. The lower insulation layer 107 may be formed on the non-active surface 100*d* and the pads 115 may be formed on the lower insulation layer 107 to be electrically connected to the through electrodes 111.

Figure 2F:
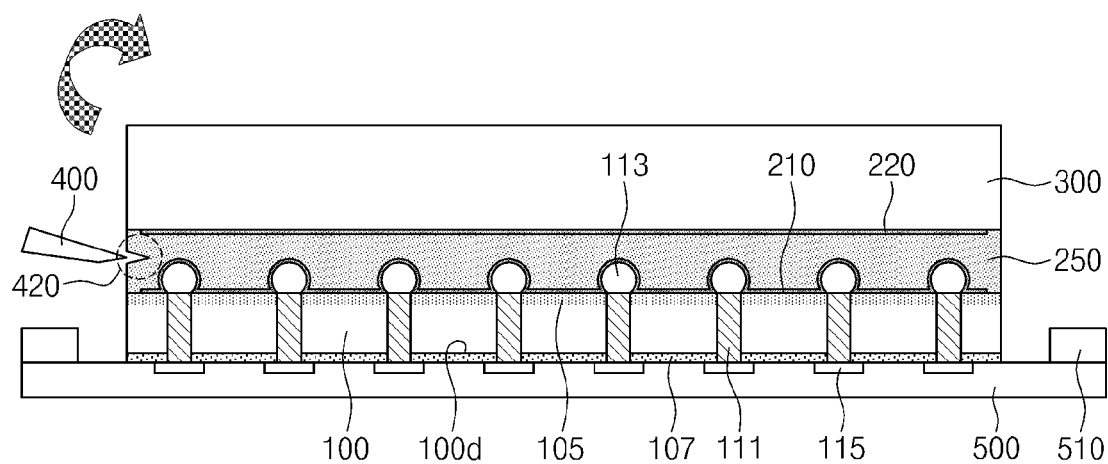

Referring to FIG. 2F, a protection tape 500 may be adhered to the non-active surface 100*d* of the wafer 100 and a crack 420 may be created in the glue layer 250 by an initiator 400, similarly to the process illustrated in FIG. 1L. The crack 420 may propagate along the second release layer 220 so that the carrier 300 may be easily separated from the glue layer 250. A residue 220*a* of the second release layer 250 may be removed by plasma treatment as illustrated for example in FIG. 1N, the glue layer 250 may be detached from the wafer 100 by a rolling tape 600 as illustrated for example in FIG. 1O, and the residue 210*a* of the first release layer 210 may be removed by the wafer cleaning. As a result, the thinned wafer 100 including the through electrode 111 may be fabricated.

Figure 3A:
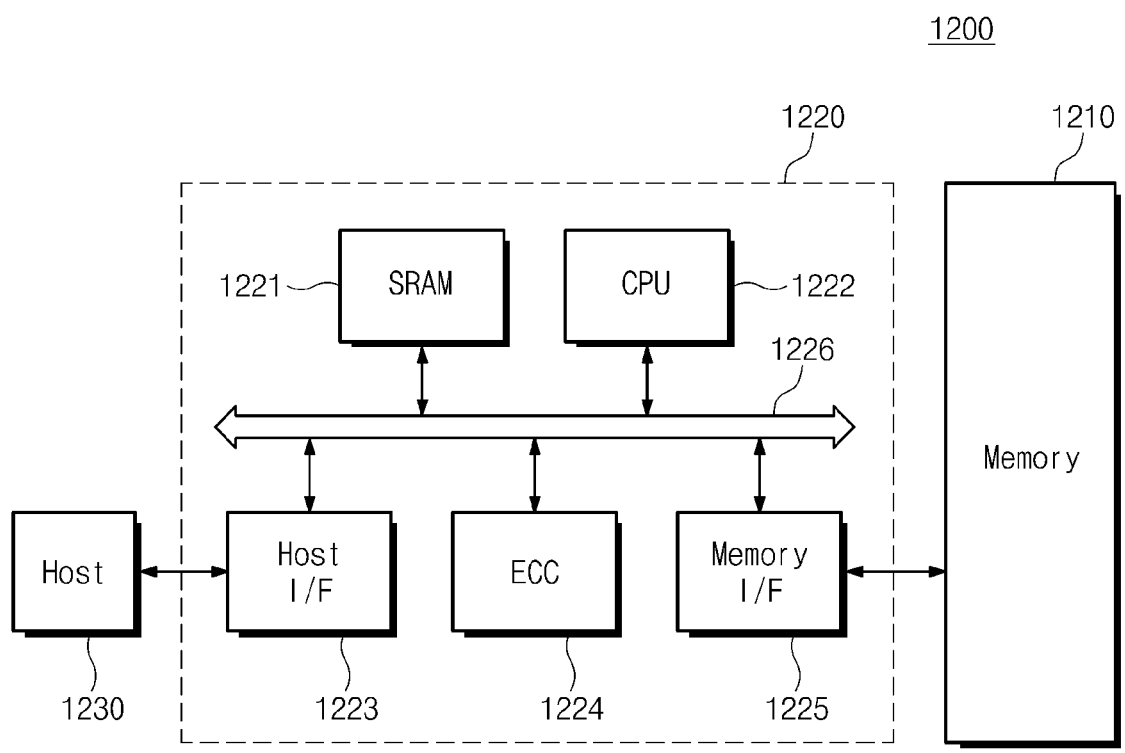
FIG. 3A is a schematic block diagram illustrating an example of memory cards including at least one of semiconductor apparatus according to exemplary embodiments of the present general inventive concept.
Figure 3B:
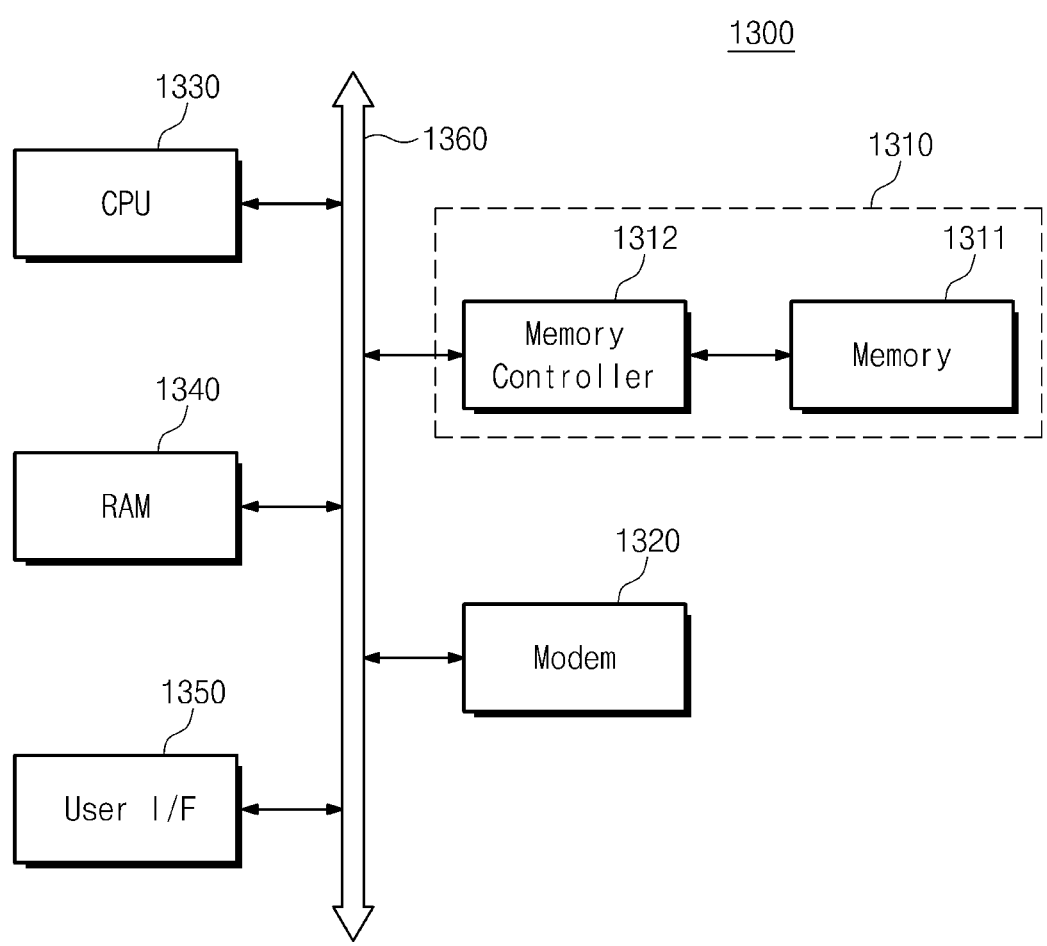
FIG. 3B is a schematic block diagram illustrating an example of information process system including at least one of semiconductor apparatus according to exemplary embodiments of the present general inventive concept.

FIG. 3A is a schematic block diagram illustrating an example of a memory card 1200 including at least one of the semiconductor chip 10 or semiconductor package 1 according to exemplary embodiments of the present general inventive concept. FIG. 3B is a schematic block diagram illustrating an example of an information processing system 1300 including at least one of the semiconductor chip 10 or semiconductor package 1 according to exemplary embodiments of the present general inventive concept.

Referring to FIG. 3A, a semiconductor memory 1210 including at least one of the semiconductor chip 10 and the semiconductor package 1 according to exemplary embodiments of the present general inventive concept is applicable to a memory card 1200. For example, the memory card 1200 may include a memory controller 1220 generally controlling data exchange between a host and the flash memory device 1210. An SRAM 1221 is used as a work memory of a processing unit 1222. A host interface 1223 has a data exchange protocol of a host connected to the memory card 1200. An error correction coding block 1224 detects and corrects errors of data that are read from the multi-bit flash memory device 1210. A memory interface 1225 interfaces the semiconductor memory device 1210 according to the exemplary embodiments of the present general inventive concept. The processing unit 1222 generally controls data exchange of the memory controller 1220. The SRAM 1221, CPU 1222, host interface 1223, error correction coding block 1224, and memory interface 1225 are electrically connected via a bus 1226.

Referring to FIG. 3B, an information processing system 1300 may include a memory system 1310 having at least one of the semiconductor chip 10 and the semiconductor package 1 according exemplary embodiments of the present general inventive concept. The information processing system 1300 may be implemented for example in a mobile device or a computer. For example, the information processing system 1300 may include a modem 1320, a central processing unit 1330, a RAM 1340, and a user interface 1350 electrically connected to the memory system 1310 via a system bus 1360. The memory system 1310 may include a memory 1311 and a memory controller 1312 and have substantially the same configuration as that of the memory card 1200 illustrated in FIG. 3A. The memory system 1310 stores data processed by the central processing unit 1330 or data input from the outside. The information processing system 1300 may be provided as a memory card, a semiconductor device disk, a camera image sensor, and other application chipsets.

According to exemplary embodiments of the present general inventive concept, the glue and release layers 250, 210, and 220 are formed of thermosetting material so that the wafer 100 and the carrier 300 can be bonded together with thermal stability. Therefore, the wafer 100 can be processed or worked in a high temperature process while the wafer 100 is firmly bonded to the carrier 300. Moreover, the carrier 300 can be easily detached from the wafer 100 even when the thermosetting glue and release layers are used. Also, the present general inventive concept may be applicable to the mass production of semiconductor apparatuses including through electrodes and may ensure stability and good quality during production.

Although the exemplary embodiments of the present general inventive concept described above are directed to using thermosetting material to bond the wafer 100 to the carrier 300, it will be understood that the present general inventive concept is not limited to thermosetting material. Any adhesive may be used which may bond the wafer 100 and the carrier 300 together with thermal stability during processing, as long as the first and second bonding forces F1 and F2 are controlled such that the carrier 300 may be easily detached from the wafer 100.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of processing a substrate, the method comprising:
providing a bonding layer between the substrate and a carrier to bond the substrate to the carrier, the bonding layer including a thermosetting glue layer having a first surface and a second surface opposite the first surface, a first release layer provided on the first surface of the thermosetting glue layer and contacting a surface of the substrate, and a second release layer provided directly on the second surface of the thermosetting glue layer and contacting a surface of the carrier;
processing the substrate while the substrate is supported by the carrier; and
removing the bonding layer to separate the substrate from the carrier,
wherein separating the substrate from the carrier comprises forming a crack on a side surface of the thermosetting glue layer by a physical contact method,
wherein the substrate includes a plurality of bumps formed on the surface of the substrate, and
the first release layer is formed on the plurality of bumps and on the surface of the substrate between the plurality of bumps,
wherein the side surface of the thermosetting glue layer connects the first surface and the second surface of the thermosetting glue layer.

2. The method of claim 1, wherein a bonding strength between the substrate and the bonding layer is greater than a bonding strength between the carrier and the bonding layer.

3. The method of claim 1, wherein providing the bonding layer comprises:
providing a first thermosetting material on the substrate to form the first release layer;
providing a second thermosetting material on the carrier to form the second release layer; and
providing a third thermosetting material on at least one of the substrate and the carrier to form the glue layer.

4. The method of claim 3, wherein forming the first release layer comprises:
coating a precursor including polydimethylsiloxane (PDMS) and hexamethyldisiloxane (HMDSO) on the substrate to form a precursor layer; and
forming a deposition layer on the precursor layer by a chemical vapor deposition where the hexamethyldisiloxane (HMDSO) is adopted as a reaction gas.

5. The method of claim 3, wherein forming the second release layer comprises:
coating a precursor including polydimethylsiloxane (PDMS) and hexamethyldisiloxane (HMDSO) on the substrate to form a precursor layer; and
forming a deposition layer on the precursor layer by a chemical vapor deposition where the hexamethyldisiloxane (HMDSO) and oxygen are adopted as a reaction gas.

6. The method of claim 3, wherein forming the thermosetting glue layer comprises:
coating siloxane or a thermosetting material including the siloxane on at least one of the first and second release layers.

7. The method of claim 3, wherein forming the bonding layer further comprises:
strengthening the first and second release layers and the thermosetting glue layer.

8. The method of claim 1, wherein separating the substrate from the carrier further comprises:
detaching the carrier from the thermosetting glue layer;
plasma treating the thermosetting glue layer;
detaching the thermosetting glue layer from the substrate; and
cleaning the substrate.

9. The method of claim 8, wherein plasma treating the thermosetting glue layer comprises:
removing a remainder of the second release layer from the thermosetting glue layer by plasma including at least one of oxygen, nitrogen, and argon.

10. The method of claim 1, wherein providing the bonding layer comprises:
providing a first thermosetting material on the substrate to form the first release layer and expose an edge of the substrate;
providing a second thermosetting material on the carrier to form the second release layer and expose an edge of the carrier; and
providing a third thermosetting material on at least one of the substrate and the carrier to form the thermosetting glue layer, the thermosetting glue layer contacting the exposed edges of the substrate and the carrier.

11. A method of processing a substrate, the method comprising:
forming a first thermosetting release layer directly on the substrate;
forming a second thermosetting release layer on a carrier;

providing a thermosetting glue layer adhesive between the substrate and the carrier to bond the substrate to the carrier, such that a first surface of the thermosetting glue layer adhesive contacts a surface of the first thermosetting release layer and a second surface of the thermosetting glue layer adhesive opposite the first surface of the thermosetting glue layer adhesive directly contacts a surface of the second thermosetting release layer;

thinning the substrate while the substrate is supported by the carrier;

separating the carrier from the thinned substrate;

plasma treating the thermosetting glue layer adhesive to remove the second thermosetting release layer on the thermosetting glue layer adhesive;

separating the thermosetting glue layer adhesive from the thinned substrate; and removing the first thermosetting release layer from the thinned substrate;

wherein the separating the thinned substrate from the carrier comprises:
  applying a physical stress on an edge of the thermosetting glue layer adhesive to form a crack on the edge of the thermosetting glue layer adhesive; and
  detaching the carrier from the thermosetting glue layer adhesive.

12. The method of claim 11, wherein: thinning the substrate comprises:
recessing a second surface of the substrate,
wherein the second surface of the substrate is opposite to a first surface of the substrate on which the first release layer is formed, and
at least one through electrode included in the substrate is exposed through the recessed second surface of the thinned substrate.

13. The method of claim 11, wherein: at least one of the first and second release layers comprises:
at least one of polydimethylsiloxane (PDMS) and hexamethyldisiloxane (HMDSO); and
the thermosetting glue layer adhesive comprises siloxane.

14. The method of claim 11, further comprising:
forming a plurality of bumps on the substrate,
wherein the first thermosetting release layer is formed directly on the bumps and directly on the substrate,
the substrate comprises a semiconductor wafer and a plurality of through electrodes electrically connected to the bumps, and
the carrier comprises a glass or a material that is identical to that of the substrate.

15. The method of claim 11, wherein removing the first release layer comprises cleaning the thinned substrate.

16. A method of processing a substrate, the method comprising:
providing a bonding layer including a thermosetting glue layer, a first release layer bonded directly to the thermosetting glue layer and bonded to a first surface of the substrate, and a second release layer bonded directly to the thermosetting glue layer and boned directly to a first surface of a carrier, a bonding force of the bonding layer and the substrate being greater than a bonding force of the bonding layer and the carrier;

processing a second surface of the substrate opposite the first surface of the substrate while the bonding layer is bonded to the substrate and the carrier is bonded to the bonding layer; and removing the bonding layer from the substrate,
wherein the first release layer is bonded directly to the first surface of the substrate and directly to bumps formed on the first surface of the substrate, the bumps directly connected to through electrodes in the substrate,
wherein removing the bonding layer comprises:
  forming a crack on a side surface of the thermosetting glue layer by a physical contact method to separate the carrier from the bonding layer; and
  removing at least the second release layer and the thermosetting glue layer from the substrate after the carrier is separated from the bonding layer,
wherein the side surface of the thermosetting glue layer connects the first surface and the second surface of the thermosetting glue layer.

17. The method of claim 16, wherein the first and second release layers comprises a thermosetting material.

18. The method of claim 17, wherein providing the bonding layer comprises:
strengthening the bonding layer by exposing it to heat.

19. The method of claim 16, wherein the thermosetting glue layer is bonded directly to at least one of an edge portion of the substrate and an edge portion of the carrier.

20. The method of claim 1, wherein forming a crack includes impacting the side surface of the thermosetting glue layer by a blade.

* * * * *